(12) United States Patent
Yang

(10) Patent No.: US 7,071,036 B2
(45) Date of Patent: Jul. 4, 2006

(54) CMOS-TFT ARRAY SUBSTRATE AND METHOD FOR FABRICATING THE SAME

(75) Inventor: Joon Young Yang, Bucheon-shi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/879,822

(22) Filed: Jun. 29, 2004

(65) Prior Publication Data

US 2005/0133791 A1    Jun. 23, 2005

(30) Foreign Application Priority Data

Dec. 23, 2003 (KR) .................... 10-2003-0095449

(51) Int. Cl.
*H01L 21/00* (2006.01)
(52) U.S. Cl. ..................................... 438/149
(58) Field of Classification Search ................ 438/149, 438/151, 154
See application file for complete search history.

(56) References Cited

U.S. PATENT DOCUMENTS

| | | | | |
|---|---|---|---|---|
| 6,140,162 A * | 10/2000 | Yeo | ............................. | 438/155 |
| 6,590,229 B1 * | 7/2003 | Yamazaki et al. | ............. | 257/71 |
| 2002/0068421 A1 * | 6/2002 | Yamazaki et al. | ........... | 438/486 |
| 2004/0096999 A1 * | 5/2004 | Lin et al. | ....................... | 438/30 |
| 2004/0197967 A1 * | 10/2004 | Chen | ........................... | 438/154 |

* cited by examiner

*Primary Examiner*—Scott Geyer
(74) *Attorney, Agent, or Firm*—Brinks Hofer Gilson & Lione

(57) ABSTRACT

A TFT array substrate includes a substrate, first–third semiconductor layers, a gate insulating layer, a storage electrode, and a passivation layer. The gate insulating layer separates the first and second semiconductor layers and separates the second and third semiconductor layers. The storage electrode is positioned above the gate insulating layer. A passivation layer encloses the top and side surfaces of the storage electrode. The storage layer and source/drain regions of the first semiconductor layer are doped at the same time.

31 Claims, 19 Drawing Sheets

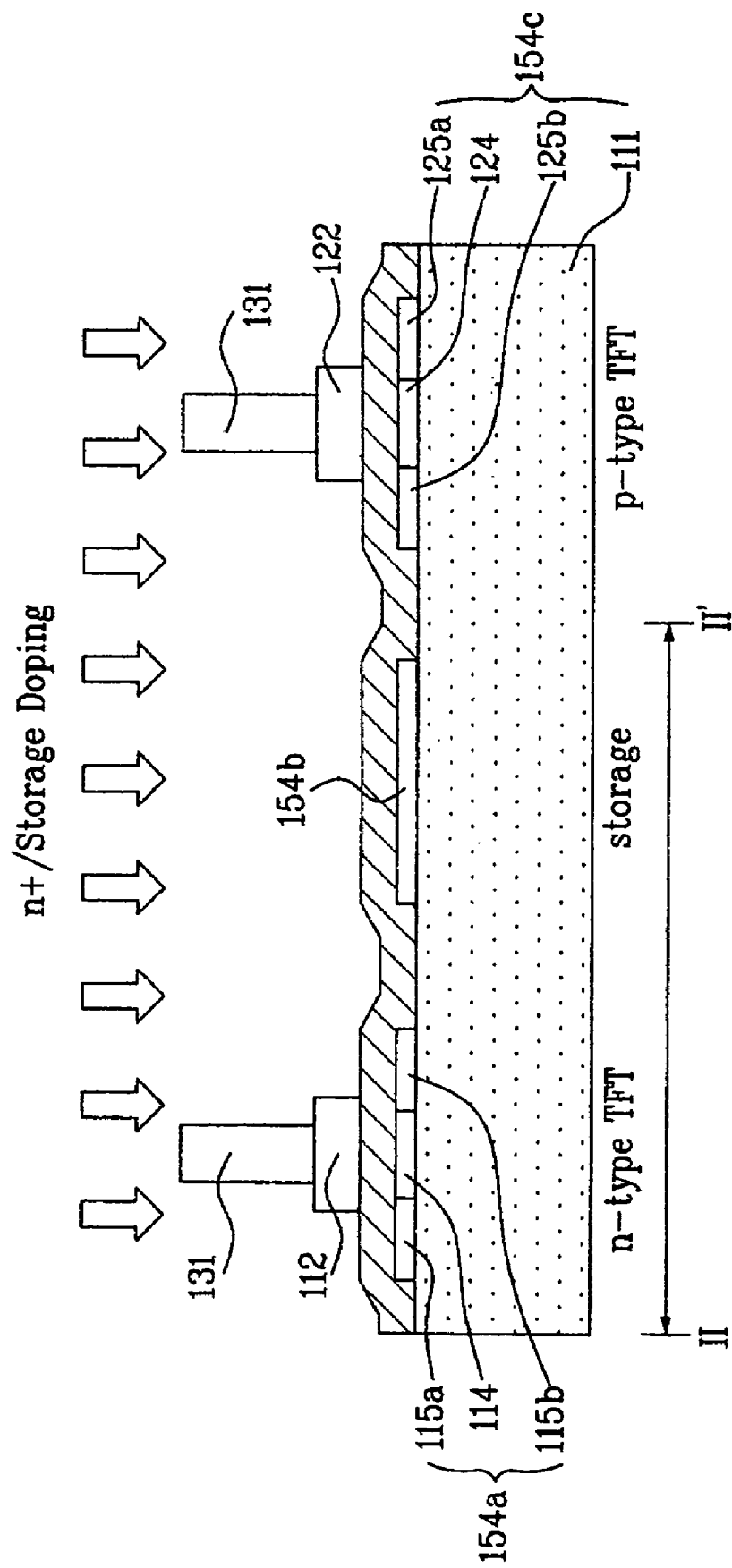

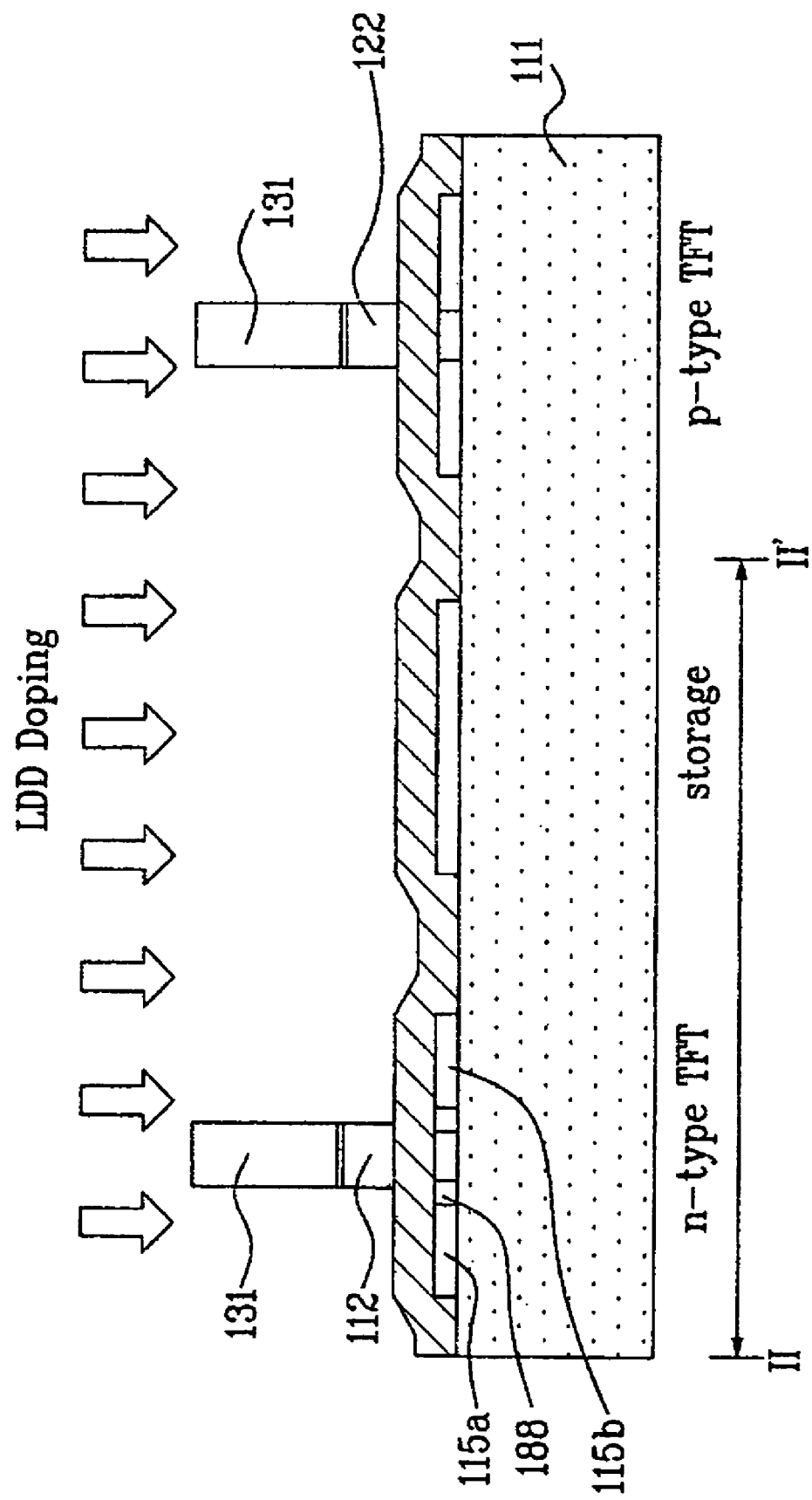

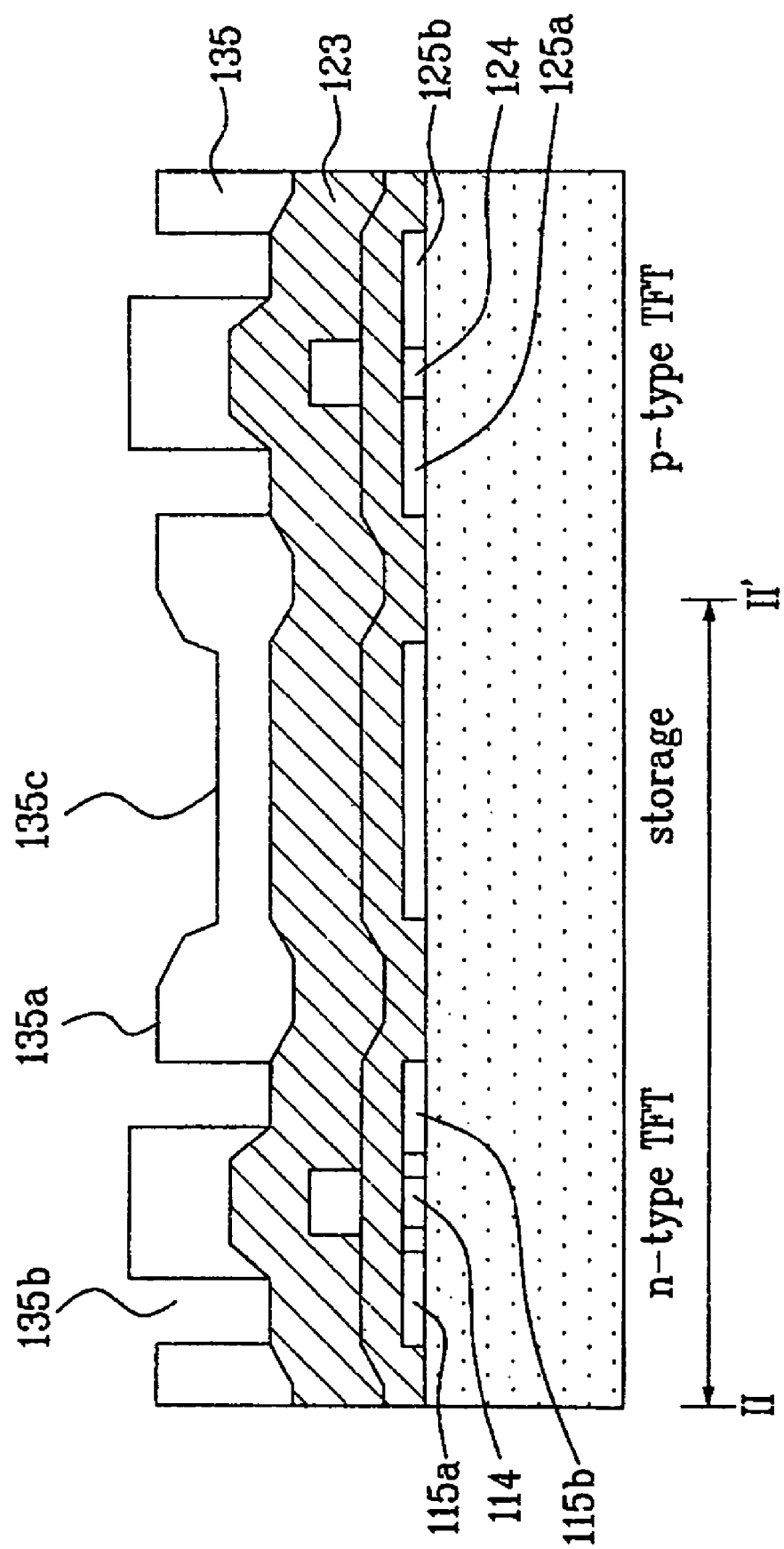

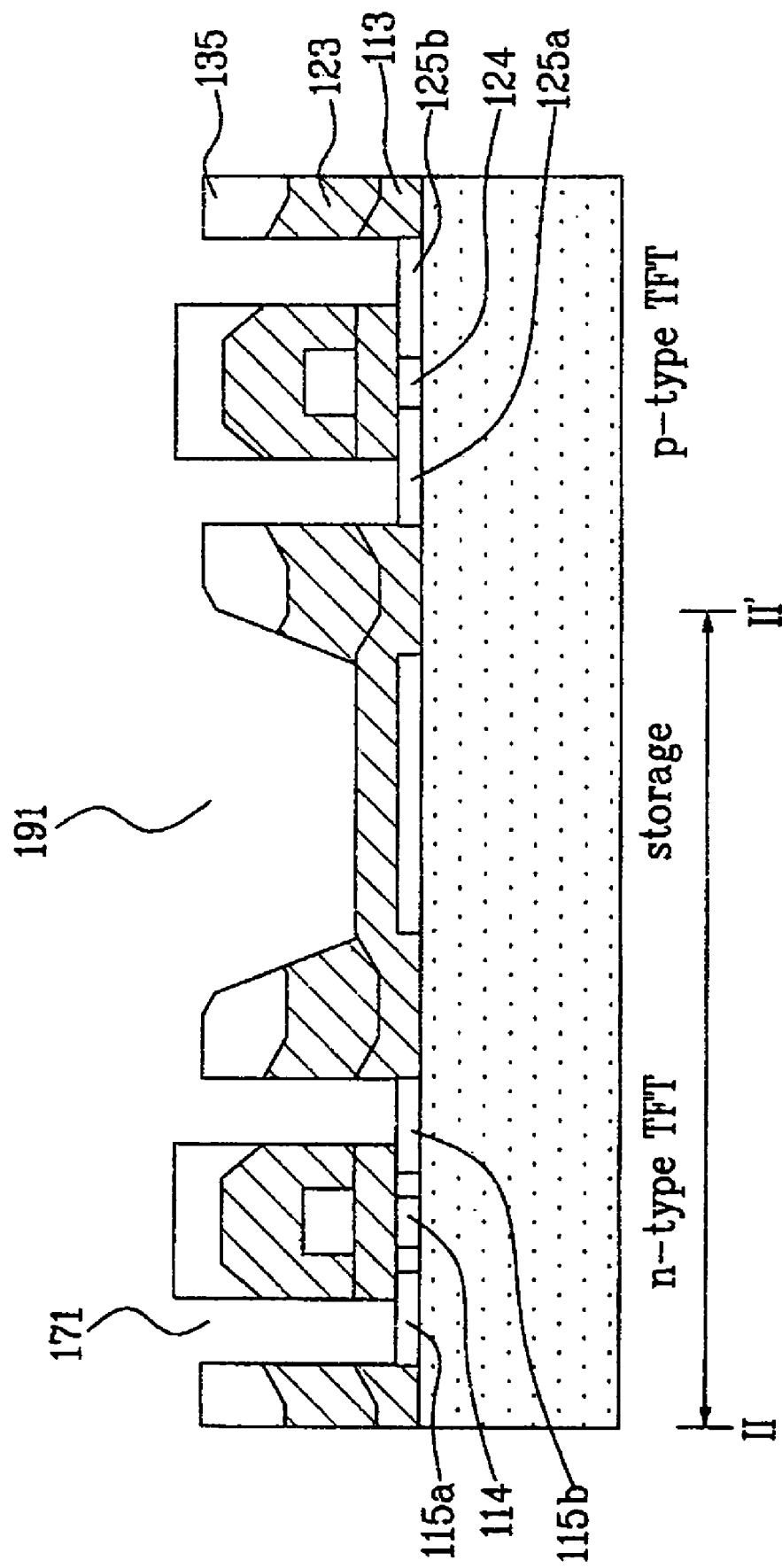

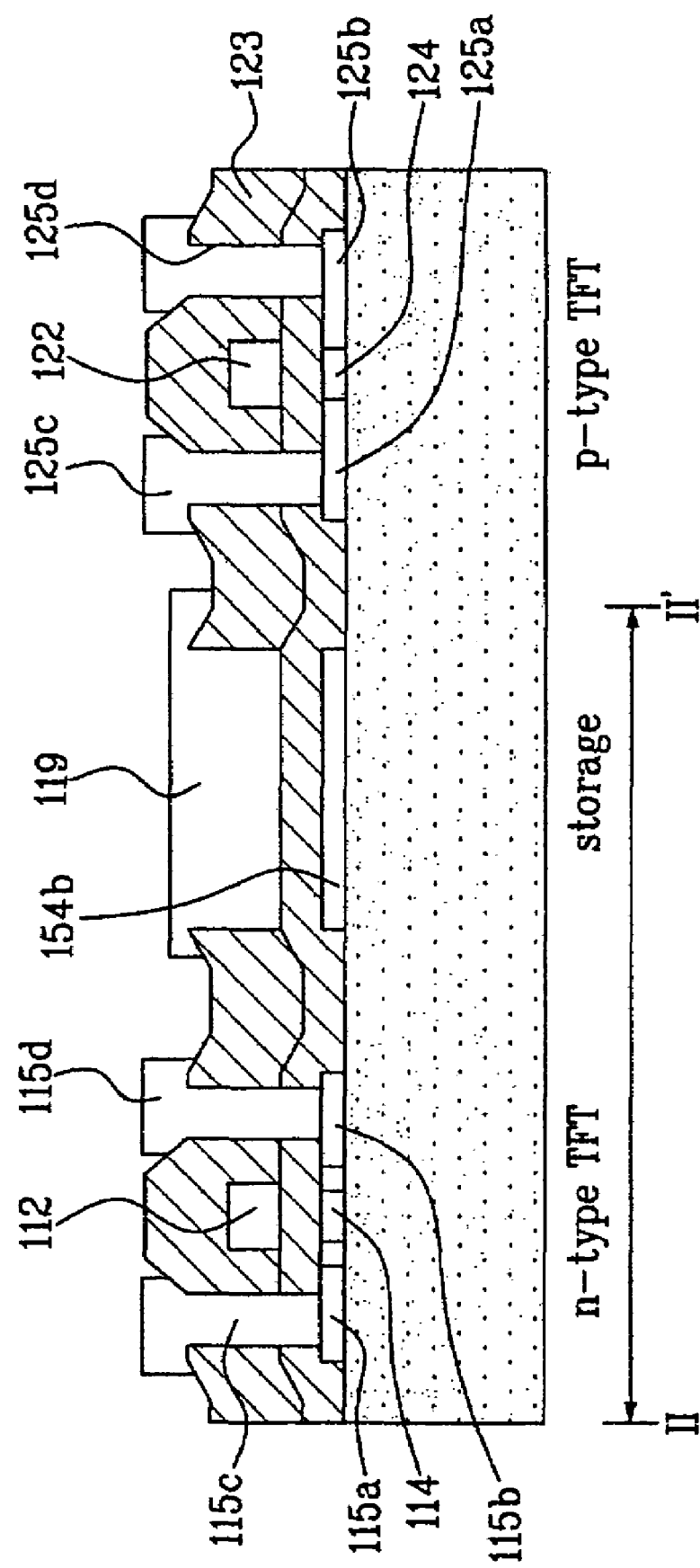

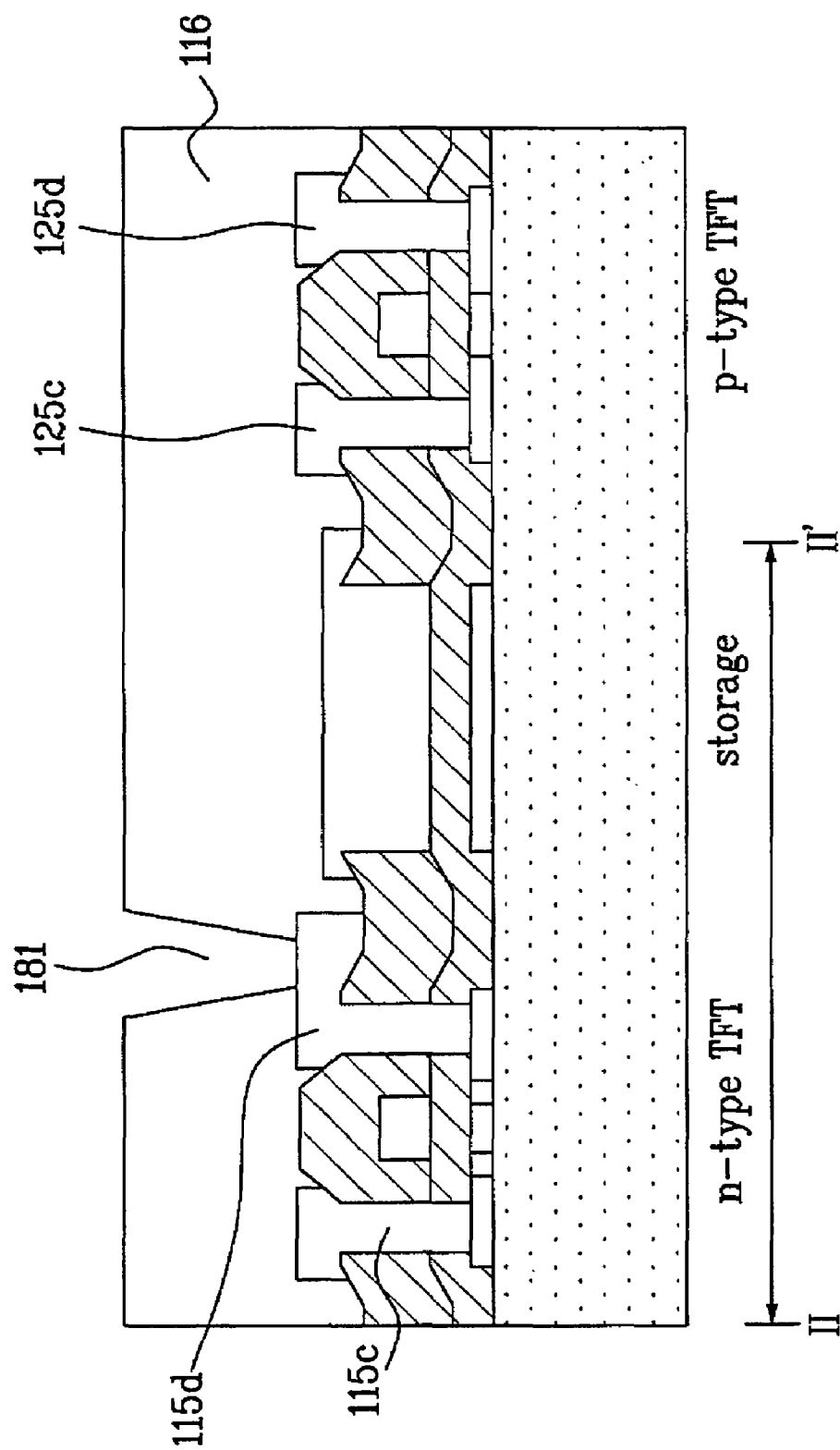

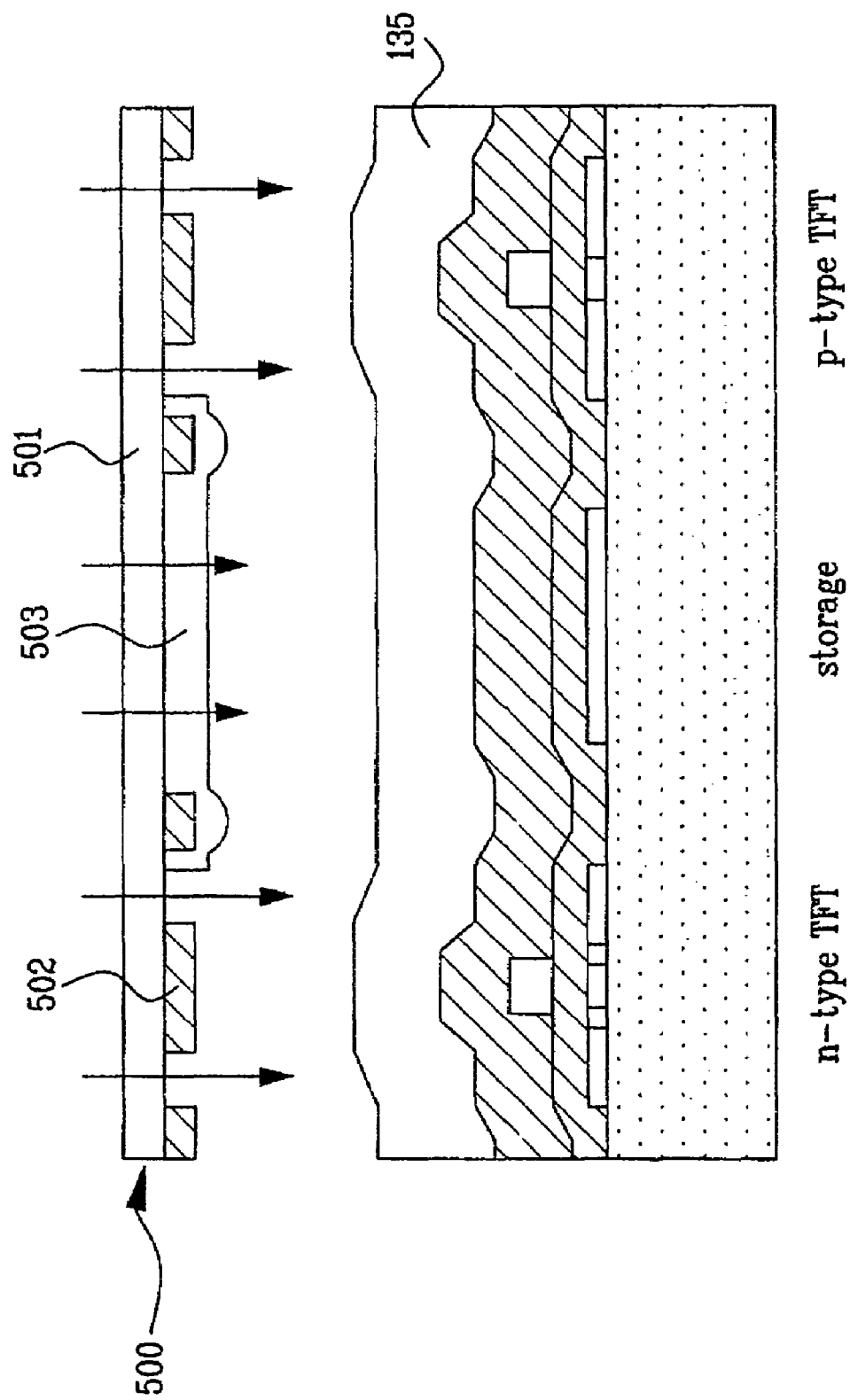

CMOS-TFT ARRAY SUBSTRATE AND METHOD FOR FABRICATING THE SAME

PRIORITY CLAIM

This application claims the benefit of the Korean Application No. P2003-95449 filed in Korea on Dec. 23, 2003. The disclosure of the application is incorporated herein by reference.

BACKGROUND

1. Technical Field

This invention relates to displays, and more particularly to an array substrate and a method of fabricating the array substrate using a low-mask technology.

2. Related Art

LCD devices may be formed on a substrate using photolithography. Photolithography is method that patterns surfaces on a substrate. To create a circuit pattern on a substrate, a pattern is first transferred onto a layer of photoresist overlying a substrate surface. Photoresist is a light sensitive-material similar to a coating on photographic film. Exposure to light through an optical mask causes changes in the photoresist's structure and properties. A second transfer takes place when etchants remove those portions of the substrate's top layer that are not covered by the photoresist.

FIG. 1 is a plan view illustrating a method of fabricating a circuit that may be used in an LCD device. In an active region having n-type TFTs, a unit pixel region is formed by crossing gate lines 12a with data lines 15. An electrode 17 in the unit pixel region applies a signal to a liquid crystal for light transmission and a storage capacitor maintains electric charge when the unit pixel region is not selected.

As shown in FIGS. 1, 2A, 2D, 2F, or 2H the n-type TFT is comprised of a first semiconductor layer 54a having a channel layer, source/drain regions, and a gate insulating layer ('13' of FIG. 2F) that overlies the first semiconductor layer 54a and underlies a first gate electrode 12 and an insulating interlayer ('23' of FIG. 2l). First source/drain electrodes 15a and 15b (FIG. 2D) are in contact with the source/drain regions of the first semiconductor layer 54a through a first contact hole 71 (FIG. 2F) in the insulating interlayer 23. The drain electrode 15b is connected to a pixel electrode 17 through a second contact hole 81 (FIG. 2H) to apply a voltage to the pixel electrode 17.

A storage capacitor may be formed through the second semiconductor layer 54b doped with an impurity. A storage electrode 19 interconnected to the storage capacitor may be formed on the same layer as the gate line 12a with a gate insulating layer 13 interposed there between (FIGS. 1 and 2H). The second semiconductor layer 54b and the storage electrode 19 extended and are biased outside of the active region.

Patterning an image onto a substrate surface is a multi-step process that has been compared to stenciling. In FIG. 2A, the process begins by depositing a buffer layer 52 of insulating material such as silicon oxide $SiO_x$ onto an insulating substrate 11. An amorphous silicon layer is then deposited onto the buffer layer 52 and crystallized into a polysilicon layer through an exposure to a laser. The polysilicon layer is then patterned to form first, second, and third semiconductor layers 54a, 54b and 54c. In FIG. 2A, the semiconductor layers 54a, 54b and 54c have island shapes, wherein the first and third semiconductor layers 54a and 54c are n-type TFT and p-type TFT, respectively, and the second semiconductor layer 54b is a storage layer.

In FIG. 2B, a first photoresist 31 is deposited across the entire top surface of the insulating substrate 11, and is then patterned using a second mask to cover the entire first semiconductor layer 54a of the n-type TFT region and the entire third semiconductor layer 54c of the p-type TFT region. A storage doping process is applied across the entire surface of the insulating substrate 11, to dope the second semiconductor layer 54b with an impurity.

As shown in FIG. 2C, an inorganic material is then deposited across the entire upper surface of the insulating substrate 11 by a PECVD process (Plasma Enhanced Chemical Vapor Deposition), to form a gate insulating layer 13. A low-resistance metal layer is then deposited on the gate insulating layer 13. The metal layer is positioned above the semiconductor layers 54a, 54b and 54c.

In FIG. 2C, the first and second gate electrodes 12 and 22 and a storage electrode 19 are patterned above the metal layer through photolithography. At this stage, the first and second gate electrodes 12 and 22 extend in different directions from the gate line 12a (of FIG. 1). The storage electrode 19 is formed in parallel with the gate line 12a, and is positioned above the second semiconductor layer 54b of the storage region to form a storage capacitor.

In FIG. 2D, the entire surface of the insulating substrate 11 is then lightly doped with an n-type impurity in which the first and second gate electrodes 12 and 22 and the storage electrode 19 are used as masks. This process forms LDD (lightly doped drain) doping layers 88 at both sides of the first and second gate electrodes 12 and 22. In FIGS. 2D and 2G, portions of the insulating substrate 11 undoped with the n-type impurity ions act as the first and second channel layers 14 and 24, whereby the LDD doping layer 88 may be controlled by an electric field in a contact region.

In FIG. 2D, a second photoresist 33 is then deposited on the entire surface of the insulating substrate 11 including the first gate electrode 12, the p-type TFT region, and the storage region leaving the first semiconductor layer 54a of the n-type TFT region exposed. As shown, the second photoresist 33 entirely covers the gate electrode 12 of the n-type TFT region. The entire surface of the insulating substrate 11 is then heavily doped with n-type impurity ions to form the first source/drain regions 15a and 15b in the first semiconductor layer 54a of the n-type TFT region.

After the second photoresist 33 is removed, a third photoresist 35 is deposited onto the entire surface of the insulating substrate 11 as shown in FIG. 2E. The third photoresist 35 is then patterned to cover the first gate electrode 12 and the storage electrode 19 while exposing the third semiconductor layer 54c of the p-type TFT region. With a portion of the upper surfaces masked, the entire surface of the insulating substrate 11 is heavily doped with p-type impurity ions to form second source/drain regions 25a and 25b in the third semiconductor layer 54c.

With the removal of the third photoresist 35 in FIG. 2F, an insulating material is deposited across the entire surface of the insulating substrate 11 through a PECVD process. A first contact hole 71 is then formed through the gate insulating layer 13 and the insulating interlayer 23 to expose portions of the first and second source/drain regions 15a, 15b, 25a and 25b. The first contact hole 71 may be formed by selectively removing portions of the gate insulating layer 13 and the insulating interlayer 23 through photolithography.

In FIG. 2G, first and second source/drain electrodes 15c, 15d, 25c and 25d are respectively connected to the first and second source/drain regions 15a, 15b, 25a and 25b through the first contact hole 71 to form the CMOS-TFT having an n-type TFT and a p-type TFT. As shown, a low-resistance metal layer is passed through the contact hole 71 and is contoured to an inner circumference of the contact hole 71 and the undulating upper surfaces of the insulating layer 23. The low resistance metal layer is patterned by photolithography. The first and second source electrodes 15c and 25c extend away from the data line ('15' of FIG. 1).

In FIG. 2G, the n-type TFT including the first gate electrode 12, the first source/drain electrodes 15c and 15d, and the first channel layer 14 are formed in each pixel region and the p-type TFT including the second gate electrode 22, the second source/drain electrodes 25c and 25d, and the second channel layer 24 is formed in the driving circuit region. The pixel region also includes the second semiconductor layer 54b, the gate insulating layer 13, and the storage electrode 19.

In FIG. 2H, an inorganic or organic insulating material is deposited on the entire surface of the insulating substrate 11 including the first source/drain electrodes 15c and 15d to form a passivation layer 16. The passivation layer 16 and the insulating interlayer 23 (FIGS. 2G and 2H) are then etched to expose the first drain electrode 15d through a second contact hole 81 through photolithography.

In FIG. 2I, ITO (indium-tin-oxide) or IZO (indium-zinc-oxide) is deposited in contact with the first drain electrode 15d through the second contact hole 81, and then patterned through photolithography to form a pixel electrode 17.

In the aforementioned multi-step process for fabricating a CMOS-TFT array substrate, circuits are patterned on the insulating substrate 11 through nine steps. Although other steps are not described, the process may further include bonding the TFTs to an opposing substrate through sealant; positioning spacers between the substrates; interjecting a liquid crystal between the two substrates to form a liquid crystal layer; and then sealing the liquid crystal layer to form the LCD device.

The present invention is directed to a system and method that minimize the number of steps needed to fabricate an array substrate. By minimizing the steps of fabrication, the process minimizes the number of steps that variations and defects may occur.

SUMMARY

A TFT array substrate comprises a substrate, semiconductor layers, a gate insulating layer, a storage electrode, and a passivation layer. The semiconductor layers include a first semiconductor layer, a second semiconductor layer, and a third semiconductor layer positioned above the substrate. The gate insulating layer separates the first semiconductor layer from the second semiconductor layer and the second semiconductor layer from the third semiconductor layer. The storage electrode is positioned above the gate insulating layer and a passivation layer directly encloses a top surface and a plurality of side surfaces of the storage electrode.

A method of making a TFT array substrate comprises providing the first semiconductor layer with first source/drain regions, providing the second semiconductor layer with a storage layer, and providing the third semiconductor layer with second source/drain regions between the substrate and the gate insulating layer. The method further provides an insulating interlayer across an upper surface that extends across a length of the substrate such that the insulating layer covers the first source/drain regions and the second/source/drain regions. The method dopes the storage layer while doping the first source/drain regions. The method may further include opening selective parts of the insulating interlayer and the gate layer to expose portions of the first source/drain regions, the second source/drain regions, and the storage region.

Other systems, method, features, and advantages of the invention will be, or will become, apparent to one with skill in the art upon examination of the following figures and detailed description. It is intended that all such additional systems, methods, features, and advantages to be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the inventions. Moreover, in the figures, like referenced numerals designate corresponding parts throughout the different views.

FIG. 2I is a ninth cross-sectional view of the partially fabricated TFT array of FIG. 1.

FIG. 4C is a third cross-sectional view of the partially fabricated TFT array of FIG. 3.

FIG. 4D is a fourth cross-sectional view of the partially fabricated TFT array of FIG. 3.

FIG. 4F is a sixth cross-sectional view of the partially fabricated TFT array of FIG. 3.

FIG. 4G is a seventh cross-sectional view of the partially fabricated TFT array of FIG. 3.

FIG. 4H is an eighth cross-sectional view of the partially fabricated TFT array of FIG. 3.

FIG. 4I is a ninth cross-sectional view of the partially fabricated TFT array of FIG. 3.

FIG. 5 is a cross-sectional view of a pattern transfer process.

DETAILED DESCRIPTION OF THE PREFERRED EMBODIMENTS

A fabricating method may improve the construction and assembly of a display. The process minimizes the acts needed to pattern TFT arrays on a substrate. In an embodiment, an n-type doping layer is constructed with a storage doping layer. The construction of these layers simultaneously reduces the number of masks needed to fabricate the TFT arrays. In another embodiment, the act of opening an insulating interlayer in the storage region occurs when the source/drain regions are exposed. The combination of these acts further reduces the number of masks needed to fabricate the TFT arrays. By minimizing the fabricating acts, the system reduces the opportunities for variations and defects.

Figure 1:
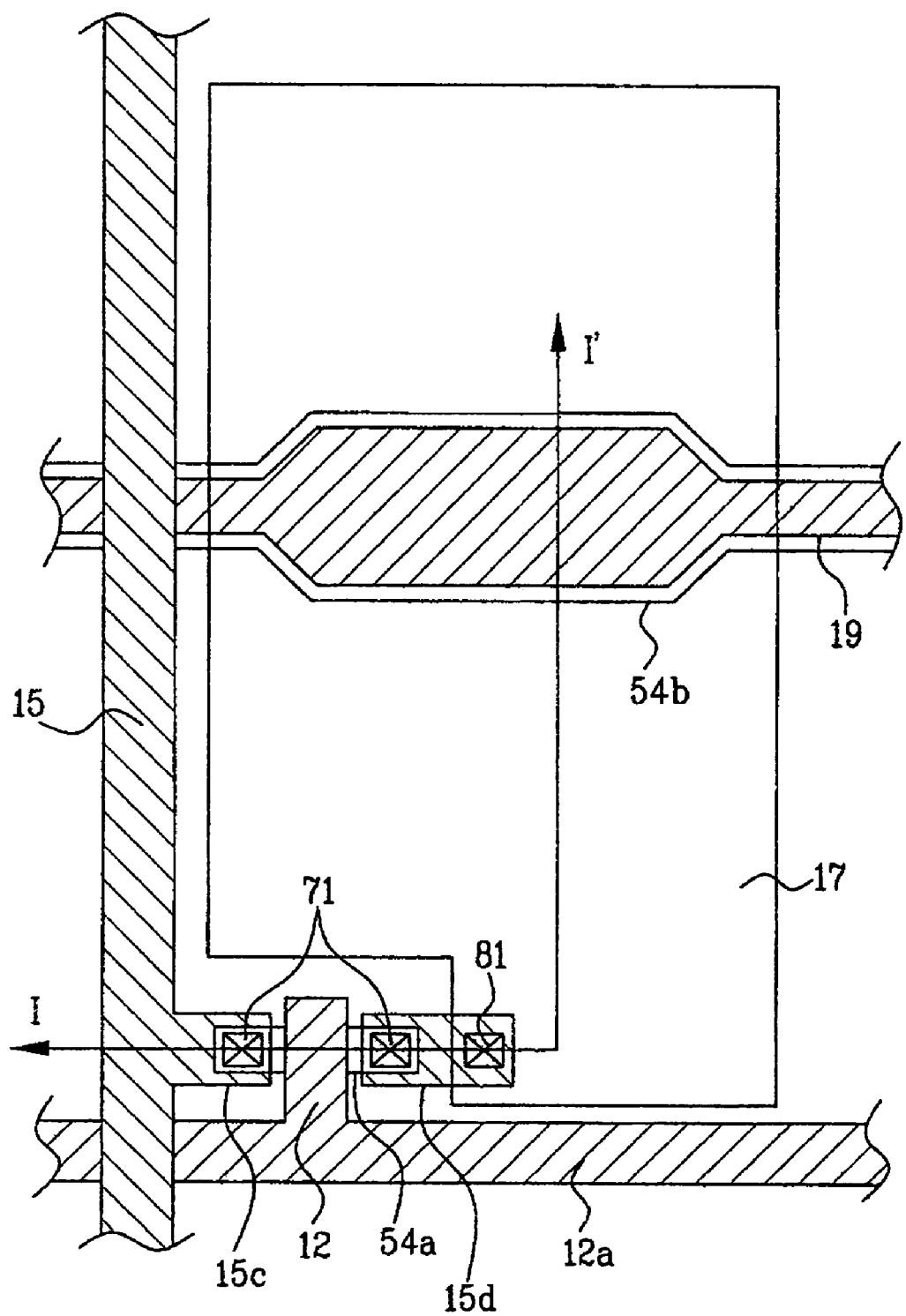
FIG. 1 is a partial plan view of a TFT array substrate in the related art.
Figure 2A:
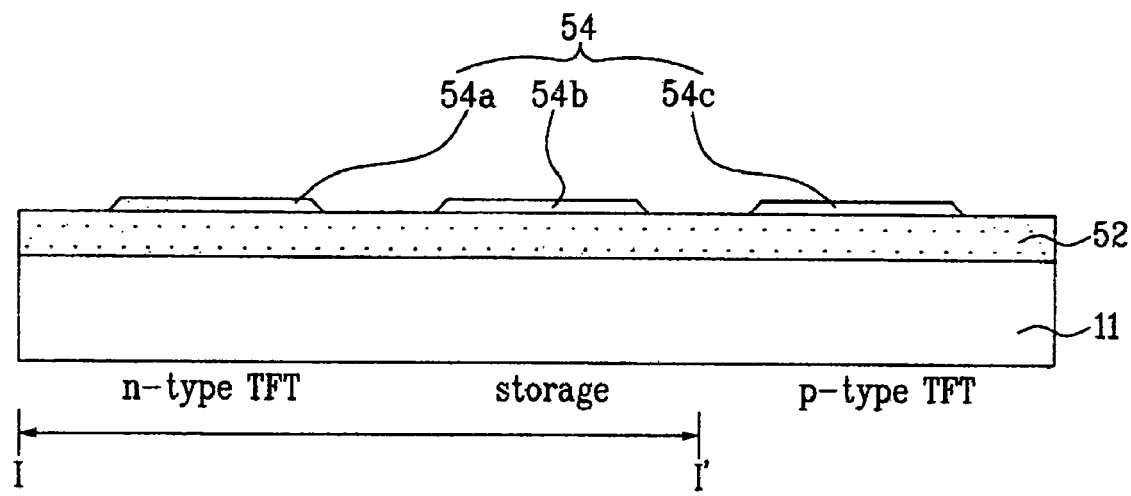
FIG. 2A is a cross-sectional view of a partially fabricated TFT array of FIG. 1.
Figure 2B:
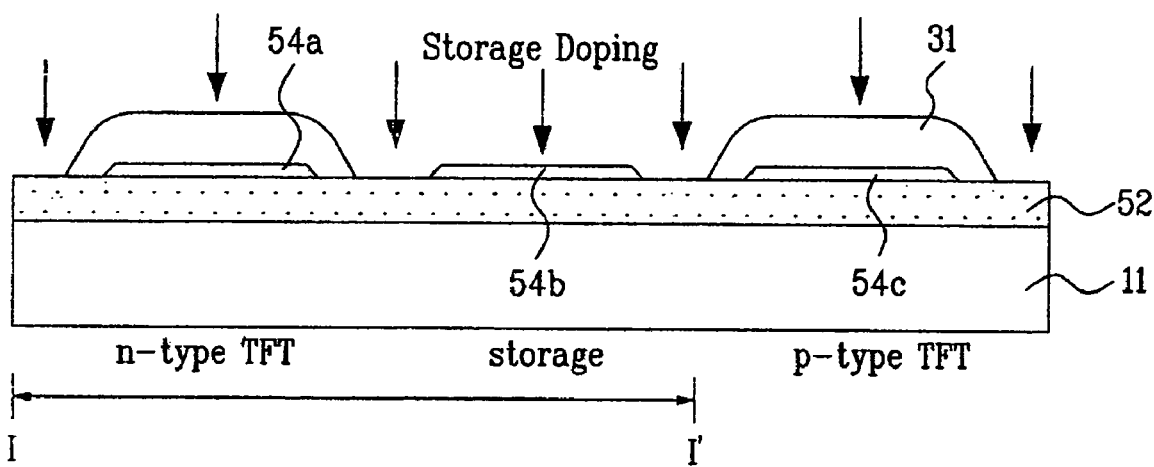
FIG. 2B is a second cross-sectional view of the partially fabricated TFT array of FIG. 1.
Figure 2C:
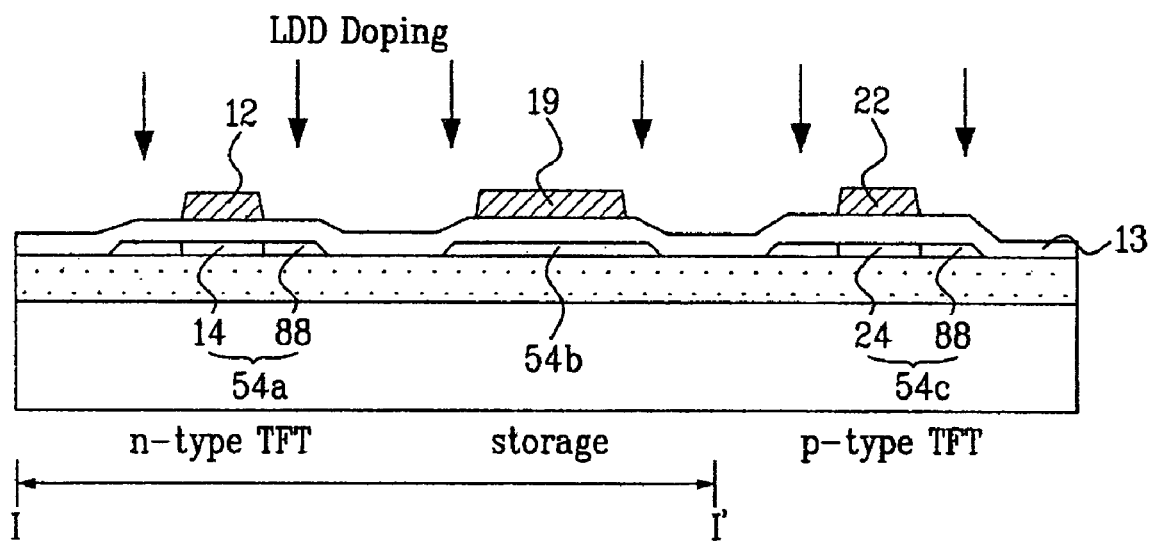
FIG. 2C is a third cross-sectional view of the partially fabricated TFT array of FIG. 1.
Figure 2D:
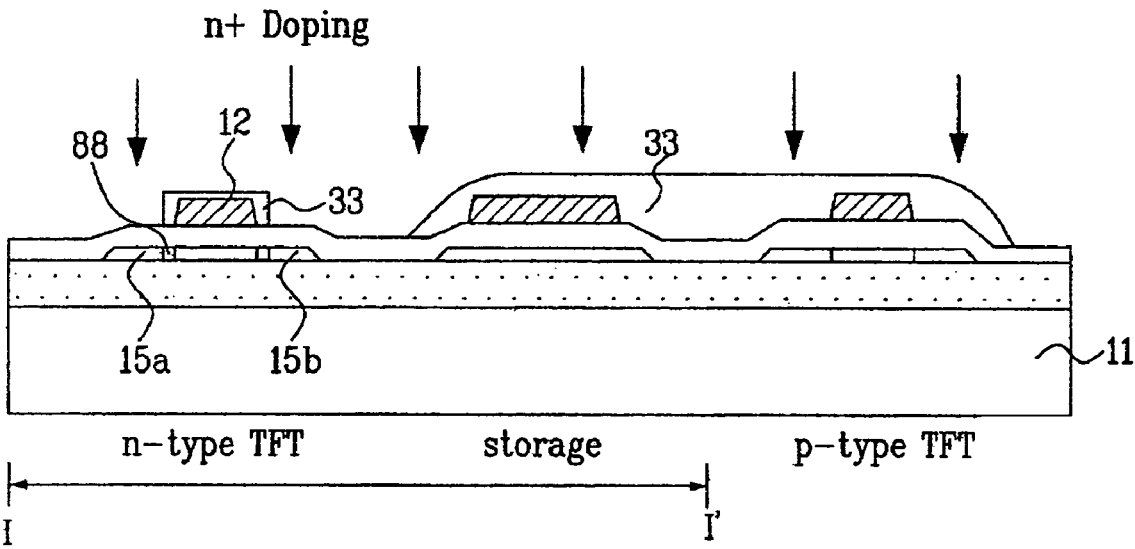
FIG. 2D is a fourth cross-sectional view of the partially fabricated TFT array of FIG. 1.
Figure 2E:
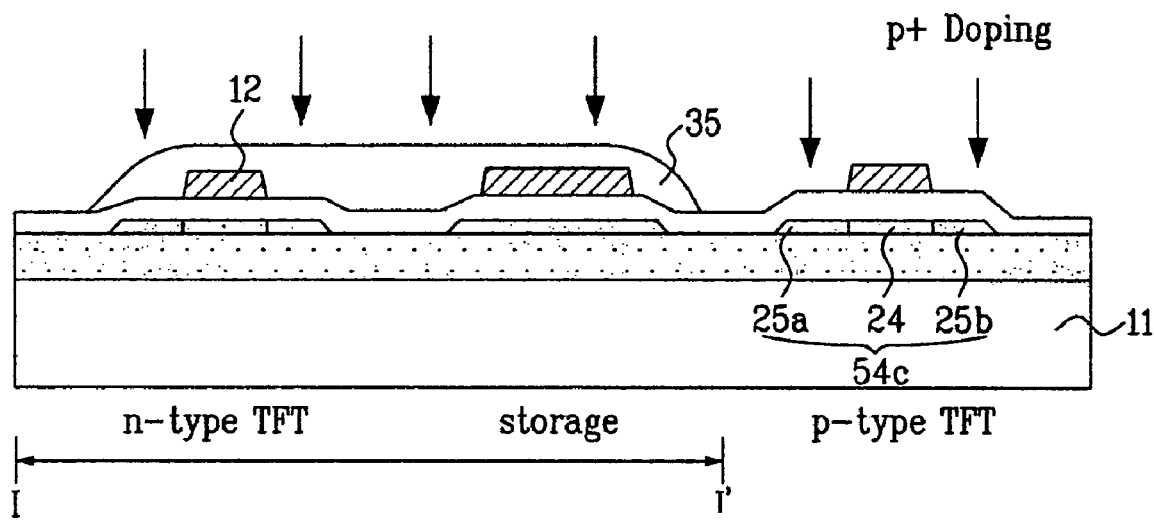
FIG. 2E is a fifth cross-sectional view of the partially fabricated TFT array of FIG. 1.
Figure 2F:
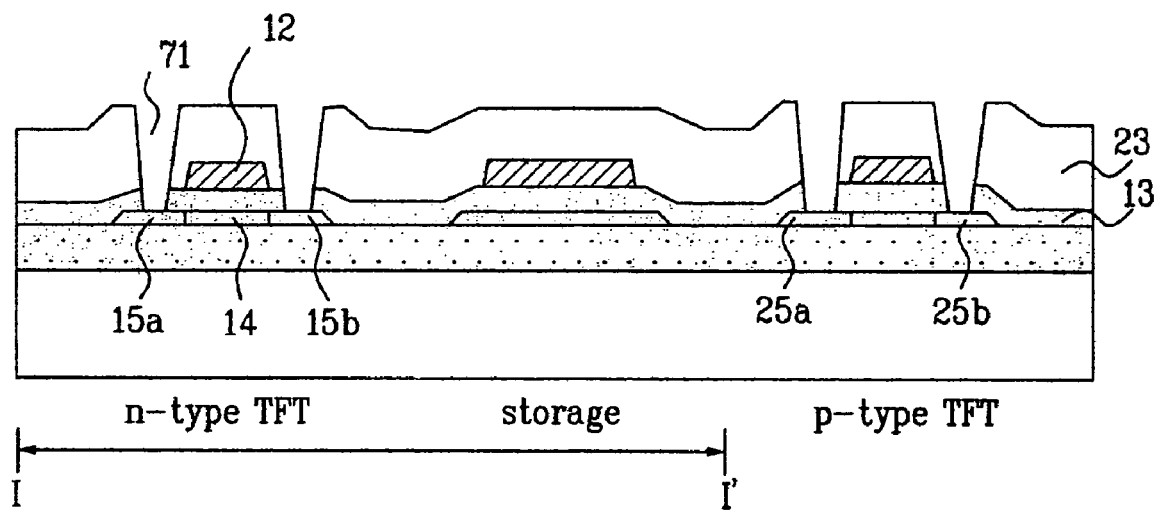
FIG. 2F is a sixth cross-sectional view of the partially fabricated TFT array of FIG. 1.
Figure 2G:
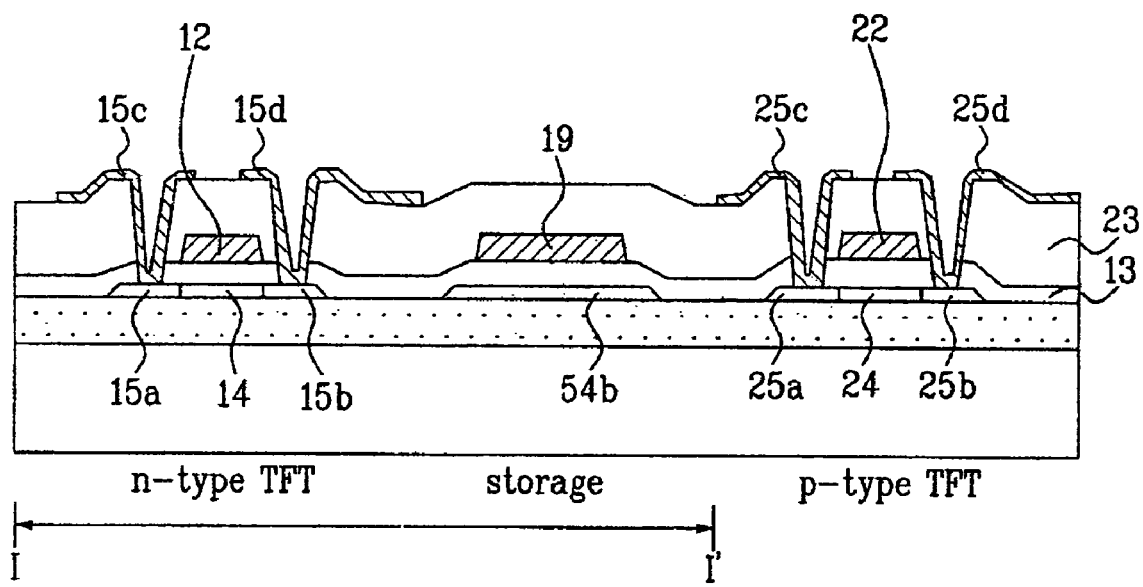
FIG. 2G is a seventh cross-sectional view of the partially fabricated TFT array of FIG. 1.
Figure 2H:
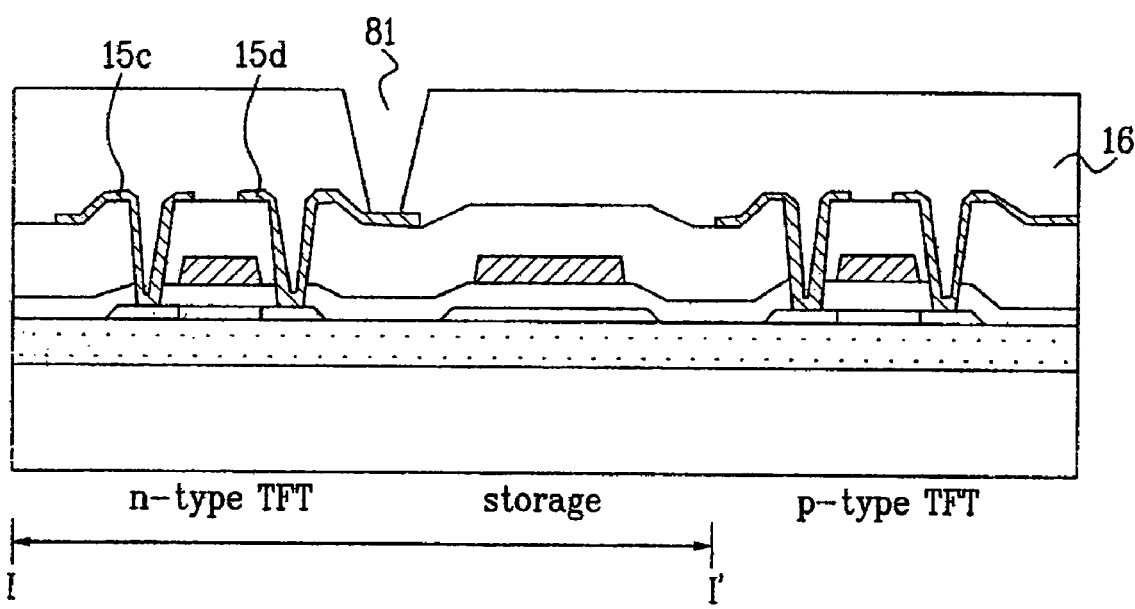
FIG. 2H is an eighth cross-sectional view of the partially fabricated TFT array of FIG. 1.
Figure 21:
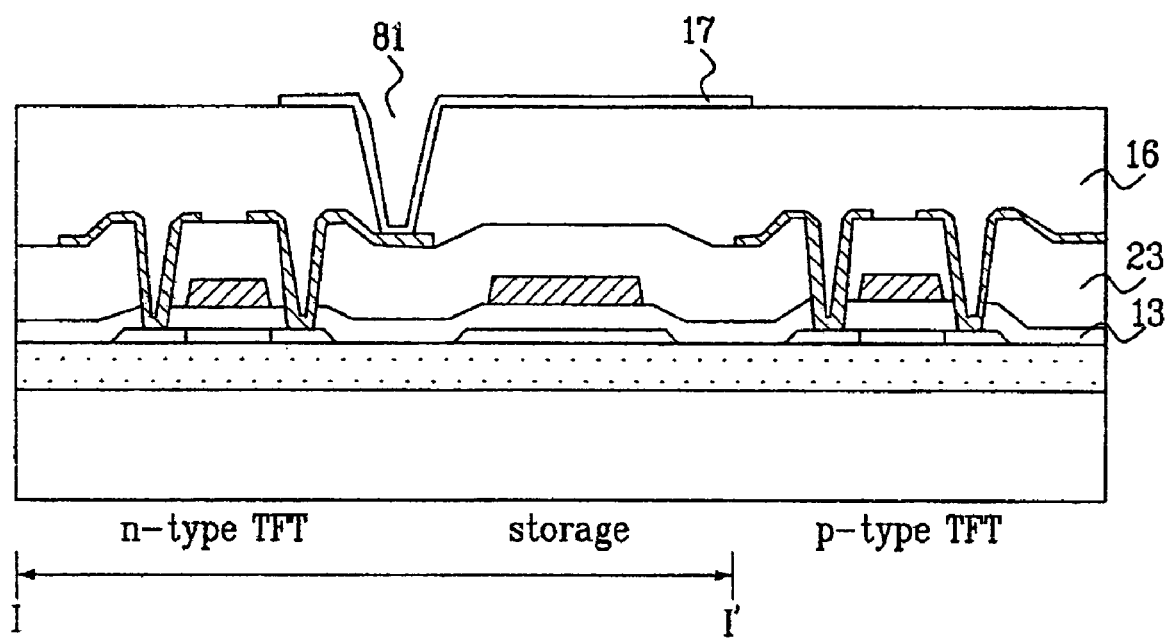
Figure 3:
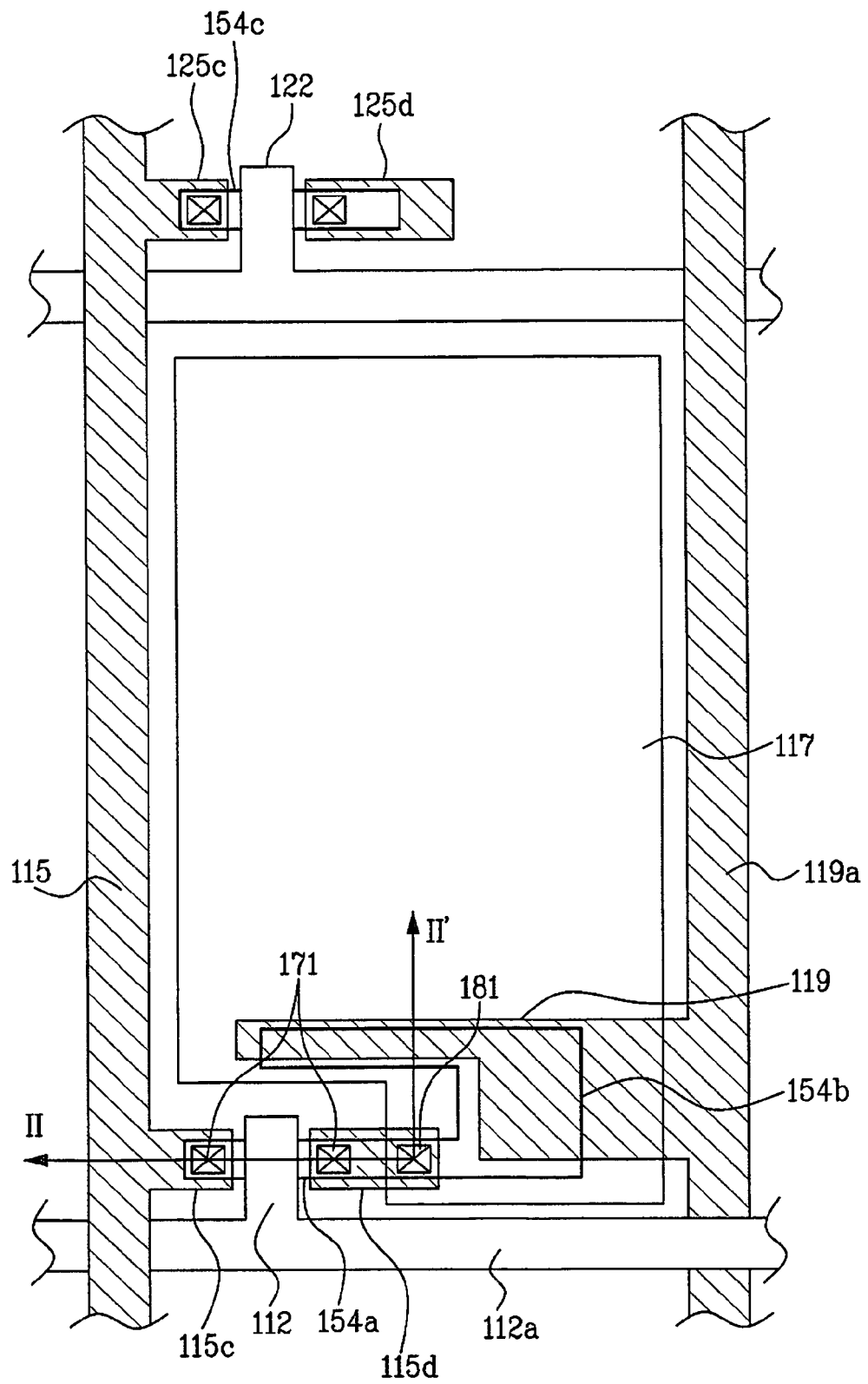
FIG. 3 is a plan view illustrating a TFT array embodiment.

FIG. 3 is a plan view of an active pixel region of a TFT array substrate, such as a CMOS-TFT array substrate. The TFT array substrate includes an active region having an n-type TFT formed at the crossings of gate and data lines 112a and 115. A pixel electrode 117 shown in FIG. 3 is coupled to a drain electrode 115d of the n-type TFT through a second contact hole 181 shown in FIG. 4I. A second semiconductor layer 154b shown in FIG. 4H coupled to the TFT serves as a lower electrode to a storage capacitor. The storage electrode 119 serving as an upper electrode of the storage capacitor is positioned across from the second semiconductor layer 154b. As shown in FIG. 3, the storage line 119a is positioned in parallel with the data line 115. The storage line 119a transmits a constant voltage to the storage electrode 119 from the outside of the active region.

Figure 4A:
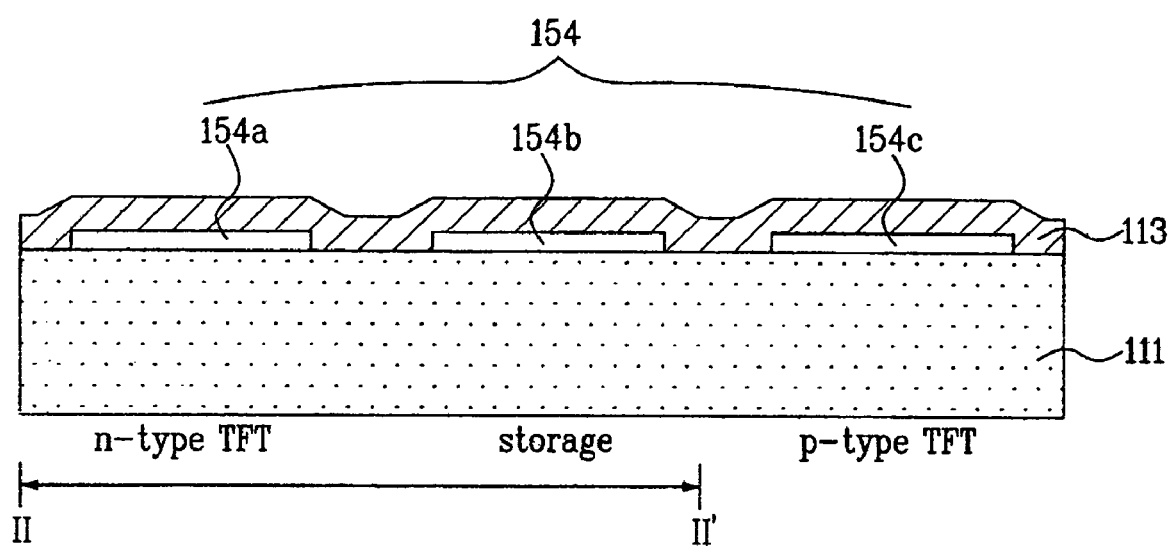
FIG. 4A is a cross-sectional view of a partially fabricated TFT array of FIG. 3.

The n-type TFT shown in FIG. 4C includes a first semiconductor layer 154a having a channel layer and source/drain regions doped with n-type impurity ions. A first gate electrode 112 is insulated from the first semiconductor layer 154a and extends over the first channel layer 114. First source/drain electrodes 115a and 115b positioned adjacent to the first channel layer 114 are insulated from the first gate electrode 112 by a gate insulating layer 113 (shown in FIG. 4G). The first source/drain electrodes 115a and 115b are in contact with the source/drain regions, respectively, of the first semiconductor layer 154a through a first contact hole 171 shown in FIG. 4G. As shown between FIGS. 3 and 4A, the first semiconductor layer 154a and the second semiconductor layer 1 54b are formed from a common layer, while the storage electrode 119 and the storage line 119a are formed on a second common layer with the gate data line 115.

A passivation layer 116 shown in FIG. 4I may be formed between the gate data line 115 and the pixel electrode 117 of FIG. 3. A gate insulating layer 113 may be partially removed between the second semiconductor layer 154b and the storage electrode 119, which forms the storage capacitor with the second semiconductor layer 154b, the gate insulating layer 113, and the storage electrode 119.

As shown in FIG. 4A, an amorphous silicon layer (a-Si:H) may be deposited on an insulating substrate 111 by a PECVD (Plasma Enhanced Chemical Vapor Deposition) process. The PECVD process may mix $SiH_4$ and $H_2$ gases. The amorphous silicon layer is crystallized into a polysilicon layer by exposure to visible or infrared light such as a laser. Once the amorphous silicon layer is crystallized to a polysilicon layer, the polysilicon layer is then patterned into a first, a second, and a third semiconductor layer 154a, 154b and 154c through photolithography using a first mask.

When the first photoresist is removed, the first and third semiconductor layers 154a and 154c corresponding to n-type and p-type TFT regions, respectively, and the second semiconductor layer 154b corresponding to a storage region can be identified. In this process, the second semiconductor layer 154b is one of the first semiconductor layers 154a that may receive a voltage.

Although not shown, a buffer layer (not shown) may be formed between the insulating substrate 111 and the semiconductor layer 154 by a CVD (Chemical Vapor Deposition) process. The buffer layer may prevent foreign materials that infect or make up the insulating substrate 111 from spreading to the semiconductor layer 154 and may also improve the contact characteristics between the semiconductor layer 154 and the insulating substrate 111.

Figure 4B:
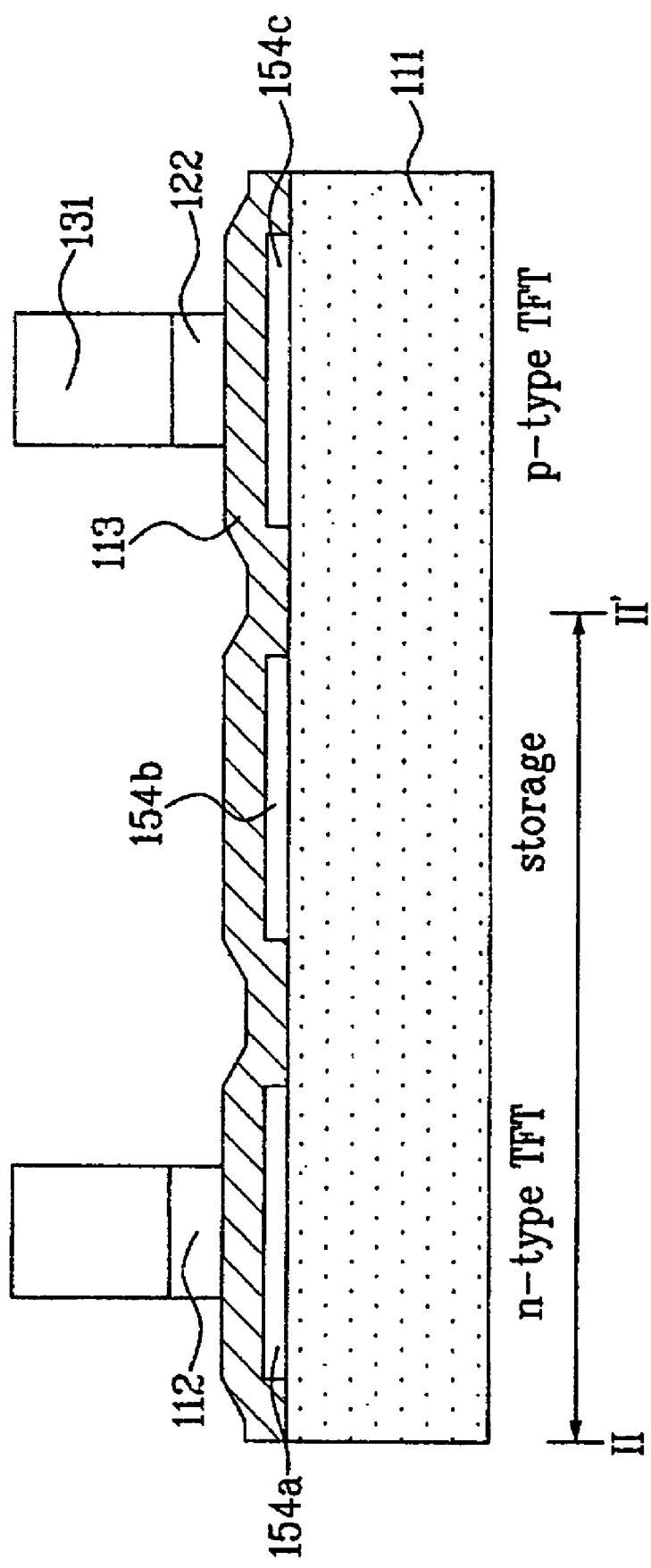
FIG. 4B is a second cross-sectional view of the partially fabricated TFT array of FIG. 3.

As shown in FIG. 4A, an inorganic insulating material such as silicon oxide $SiO_x$ or silicon nitride $SiN_x$ may be deposited on an entire surface of the insulating substrate 111 including the semiconductor layer 154 by a PEVD process (Plasma Enhanced Chemical Vapor Deposition), to form a gate insulating layer 113. A low-resistance metal layer such as copper Cu, aluminum alloy AlNd, molybdenum Mo, chrome Cr, titanium Ti, tantalum Ta, or molybdenum-tungsten MoW may then be deposited on the gate insulating layer 113. After patterning the second photoresist 131 (a second mask shown in FIG. 4B) through a light exposure, the low-resistance metal layer is then etched, thereby forming the first and second gate electrodes 112 and 122. At this stage, the first gate electrode 112 is formed in a portion corresponding to a first channel layer 114 of the first semiconductor layer 154a, and the second gate electrode 122 is formed in a portion corresponding to the second channel layer 124 of the third semiconductor layer 154c (FIG. 4C). As shown, the first and second gate electrodes 112 and 122 extend in different directions from the gate line.

In this embodiment, the first and second gate electrodes 112 and 122 are not formed at the same time as the storage electrode 119 shown in FIG. 4H. Instead, the storage electrode 119 is formed after the first and second gate electrodes 112 and 122 of a polysilicon layer. The polysilicon layer may have a high melting point, may be easily adapted to a thin film, may easily form a line pattern, remain stable in an oxidation atmosphere, and may be formed with flat surfaces.

A wet-etch method may be used to etch the low-resistance metal layer used to make the gate electrodes 112 and 122. One wet-etch method may use HF (Hydrofluoric Acid), BOE (Buffered Oxide Etchant), $NH_4F$ or a mixture thereof. The wet-etch method may comprise a dipping method in which the insulating substrate 111 is dipped into a chemical etchant, or it may comprise a spraying method in which a chemical etchant is sprayed onto the insulating substrate 111.

In FIG. 4C, a second photoresist pattern 131 may be dimensioned or thinned by ashing. Heavily doped n-type impurity ions are implanted into the semiconductor layer 154 while the second photoresist layer 131 and the first and second gate electrodes 112 and 122 serve as masks. First and second source/drain regions 115a, 115b, 125a and 125b having n-type doping layers are formed in the n-type TFT region and the p-type TFT region by doping phosphorus ions P and arsenic ions As. As the semiconductor layer 154 is heavily doped, a storage-doping layer is simultaneously formed in the second semiconductor layer 154b of the storage region. By doping the first and second source/drain regions 115a, 115b, 125a and 125b with n-type matter while forming a storage forming layer the number of masks needed to fabricate the TFT arrays are reduced. The first source/drain regions 115a and 115b and the storage-doping layer then form active regions.

As shown in FIG. 4C, the first and third semiconductor layers 154a and 154c that have not been implanted with n-type impurity ions become the first and second channel layers 114 and 124. In the p-type TFT region, the source/drain regions 125a and 125b that are rich in electrons (N-Type) are given a positive electrical charge (P-Type) when implanted with the p-type impurity ions.

As shown in FIG. 4D, sidewalls of the first and second gate electrodes 112 and 122 are etched through an etch-back process with the thin second photoresist 131 acting as a thin mask. Through this process an LDD doping layer 188 is formed in the first semiconductor layer 154a. With the first and second gate electrodes 112 and 122 having etched sidewalls acting as a mask, n-type impurity ions lightly dope the LDD doping layer 188. The LDD doping layer 188 (one being referenced in FIG. 4D) is formed between the first and second source/drain regions 115a and 115b; 125a and 125b, respectively, is adjacent to the first and second gate electrodes 112 and 122, whereby the LDD doping layer 188 decreases a turn-off current by decreasing the electric field of a contact region. Since the second semiconductor layer 154b of the storage region is an n-type doping layer, the addition of the lightly doped n-type impurity ions has little effect.

Figure 4E:
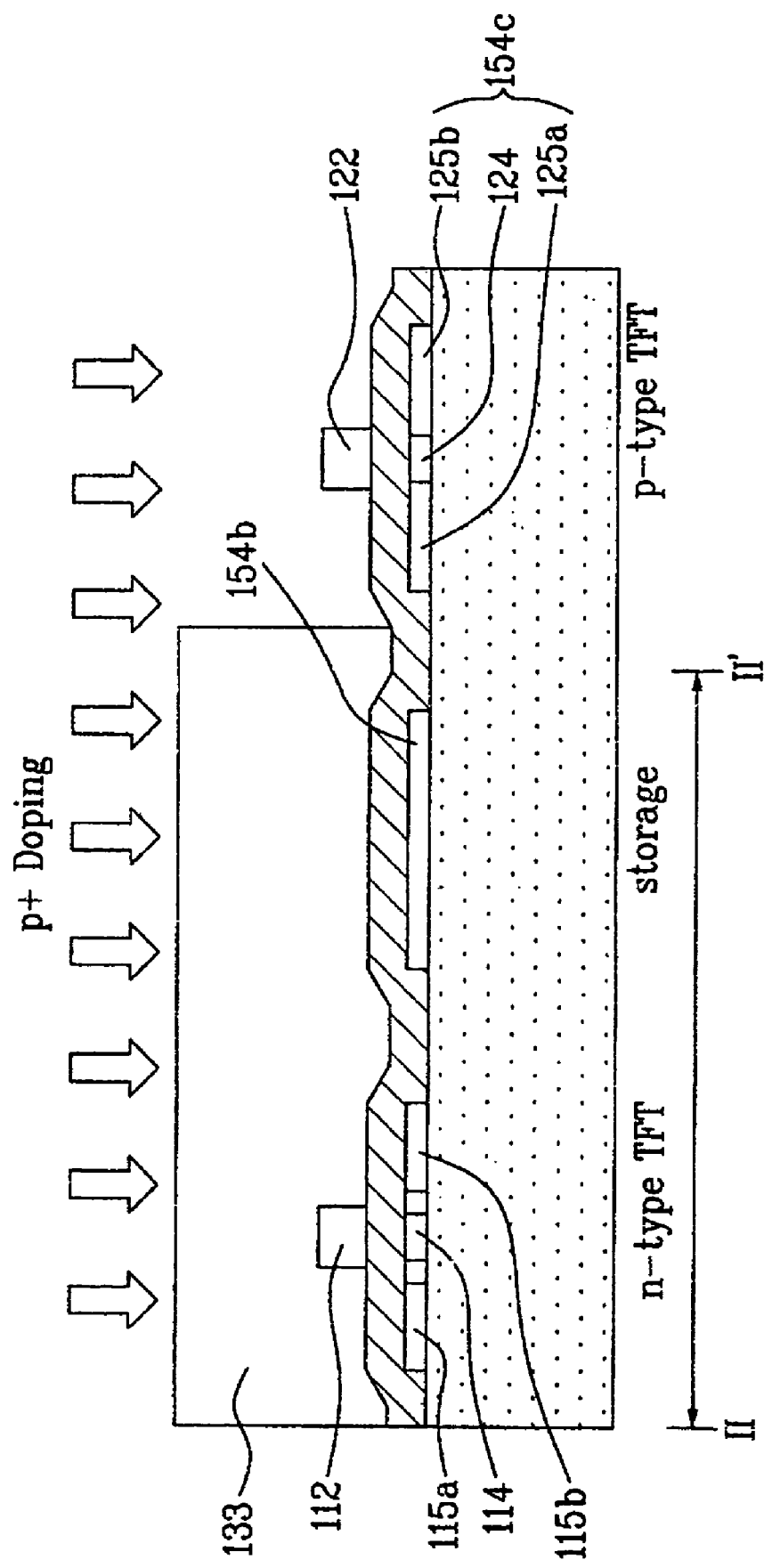
FIG. 4E is a fifth cross-sectional view of the partially fabricated TFT array of FIG. 3.

In FIG. 4E, the second photoresist 131 is then removed, and a third photoresist 133 deposited across the entire surface of the insulating substrate 111 including the first and second gate electrodes 112 and 122. Once the third photoresist 133 is applied, it is patterned through photolithography using a third mask to expose the third semiconductor layer 154c of the p-type TFT region. Then, the entire surface of the substrate 111 is counter-doped with p-type ions such as boron B ions or $BF_2$ ions, to enrich the second source/drain regions 125a and 125b of the p-type TFT region with electrical holes (P-type). This process electrically activates the second source/drain regions 125a and 125b. In this stage, the undoped third semiconductor layer 154c serves as the second channel layer 124. The p-type ions are not implanted in the remaining portions of the third semiconductor layer 154c that are blocked by the third photoresist 133. The counter-doping used in this embodiment is opposite in charge to the charge that swept across the LDD layer 188. The ions used in the p-type doping are spread across the insulating substrate 111 at a predetermined angle to strengthen the doping intensity of the LDD region of the insulating substrate 111. Thus, the counter-doping for the LDD ions implantation is followed to solve a potential punch-through problem. A punch-through phenomenon may be generated by a short channel effect, wherein the size of device decreases as the integration of device increases, so that it is difficult to stably operate the device for a long time due to a large internal electric field.

In FIG. 4F, the third photoresist 133 is removed, and an insulating material such as silicon oxide or silicon nitride is deposited on the entire surface of the insulating substrate 111 including the first gate electrode 112 by a PECVD process that forms the insulating interlayer 123. A fourth photoresist 135 having a photosensitive characteristic is then formed on the entire surface of the insulating substrate 111 including the insulating interlayer 123. The fourth photoresist 135 may then be patterned by a diffraction exposure and development method using a fourth mask. For the diffraction exposure and development method, the fourth mask may be made of a half-tone mask or a slit mask.

As shown in FIG. 5, the half-tone mask 500 may be positioned above the fourth photoresist 135. The half-tone mask 500 may be comprised of a transparent substrate 501, a light-shielding layer 502 (which may be made of metal), and a semitransparent layer 503 partially covering the light-shielding layer 502. As shown, the half-tone mask 500 includes a transparent region, a semitransparent region, and a closed region. In some embodiments, the transparent region has light transmittance of about 100%, the closed region has light transmittance of about 0%, and the semi-transparent region has light transmittance between about 0% and about 100%.

Accordingly, after the diffraction exposure process, the fourth photoresist 135 has a complete exposure part, a complete non-exposure part, and a diffraction exposure part. The complete exposure part may correspond to the transparent region of the half-tone mask 500, the complete non-exposure part may correspond to the closed region, and the diffraction exposure part may correspond to the semi-transparent region. At this stage, the complete exposure part of the exposed fourth photoresist 135 is removed almost completely, the diffraction exposure part is thinner than other parts of the photoresist, and the complete non-exposure part remains almost unchanged. As shown, the exposed portion is not removed in the positive photoresist, and the unexposed portion is removed in the negative photoresist.

Figure 6:
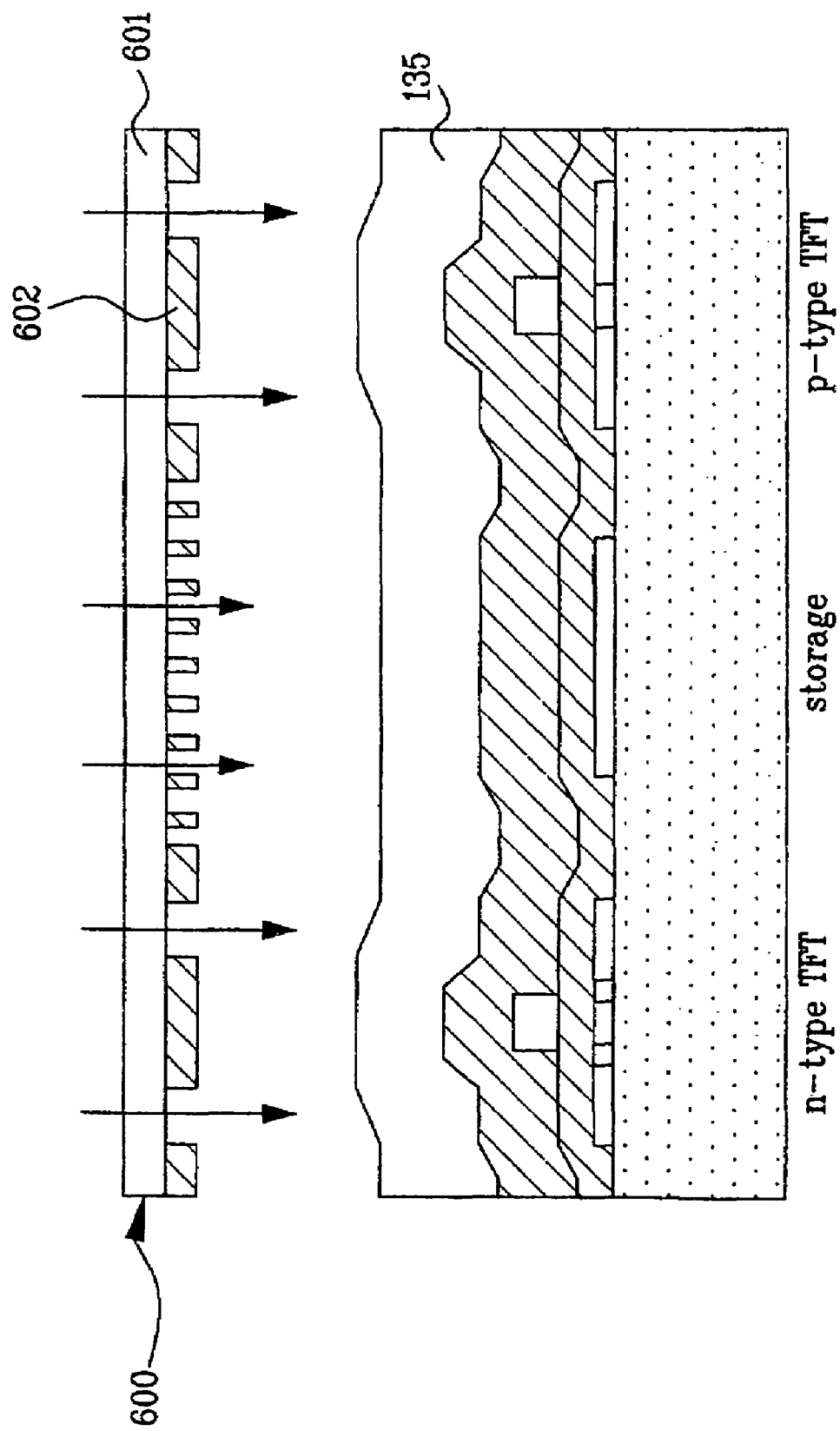
FIG. 6 is a second cross-sectional view of a pattern transfer process.

The fourth mask may be used as a slit mask as shown in FIG. 6. The slit mask 600 may be positioned above the fourth photoresist 135. The slit mask 600 is comprised of a transparent substrate 601, a photo-shield layer 602 (e.g., such as a metal layer) partially covering the transparent substrate 601, and slits 603 passing through selected portions of the photo-shield layer 602 at predetermined intervals. The slit mask 600 includes a transparent region, a semitransparent region, and a closed region. In some embodiments, the transparent region has light transmittance of about 100%, the closed region has light transmittance of about 0%, and the semitransparent region has light transmittance between about 0% and about 100%. In some semi-transparent region embodiments, a plurality of slits are formed between the photo-shield metal layer, respectively. In FIG. 6, the light transmittance of the semitransparent region depends on the width of the slits.

Accordingly, after a diffraction exposure process, the fourth photoresist 135 has a complete exposure part, a complete non-exposure part, and a diffraction exposure part. The complete exposure part may correspond to the transparent region of the slit mask 600, the complete non-exposure part may correspond to the closed region, and the diffraction exposure part may correspond to the semitransparent region having the plurality of slits 603. At this stage, the complete exposure part of the diffraction exposed fourth photoresist 135 is removed completely, the diffraction exposure part is thinner than the other parts of the photoresist 135, and the complete non-exposure part or the photoresist 135 remains almost unchanged.

As further shown in FIG. 4F the fourth photoresist 135a corresponding to the complete non-exposure part is relatively thick, the fourth photoresist 135b corresponding to the complete exposure part is almost completely removed, and the fourth photoresist 135c corresponding to the diffraction exposure part is thinner than the fourth photoresist 135a that corresponds to the complete non-exposure part.

As shown in FIG. 4G, the insulating interlayer 123 and the gate insulating layer 113 are selectively removed by using the patterned fourth photoresist 135 as the mask. In this process, the first contact holes 171 (one is labeled) in the first and second source/drain regions 115a, 115b, 125a and 125b of the n-type TFT and the p-type TFT are formed. Step differences within the fourth photoresist 135 are then decreased by ashing. At this stage, the ashing process is continued until the diffraction exposure part of the fourth photoresist 135 is removed almost completely, to expose the insulating interlayer 123. Then, the exposed insulating interlayer 123 is selectively removed to form a storage open region 191.

To etch the gate insulating layer 113 or the insulating interlayer 123, a dry-etch method may be used. In the dry-etch method, a gas may be sprayed into a chamber at a high pressure state, before it is transformed into a plasma where positive ion or radical etch a predetermined portion of a layer. When a dry-etch method is used to etch an insulating layer, the etching process may improve pattern accuracy. The dry-etch method may be divided into PE (Plasma Etching), RIE (Reactive Ion Etching), MERIE (Magnetically Enhanced Reactive Ion Etching), ECR (Electron Cyclotron Resonance), and TCP (Transformer Coupled Plasma) modes. Among these modes, the PE and RIE modes can be more frequently used when fabricating LCD devices.

As shown in FIG. 4H, once the fourth photoresist 135 is removed, a low-resistance metal layer, that may comprise, copper Cu, aluminum Al, aluminum alloy AlNd, molybdenum Mo, chrome Cr, titanium Ti, tantalum Ta, and/or molybdenum-tungsten MoW, is formed to fill in the first contact hole 171 and the storage open region 191, before a fifth photoresist (not shown) is deposited thereon. As shown, the first and second source drain electrodes 115b, 115c, 125c, and 125d are solid rectangular or solid cylindrical shapes that terminate at cross-like ends. Their upper faces lie within a substantially flat horizontal plane.

Figure 4J:
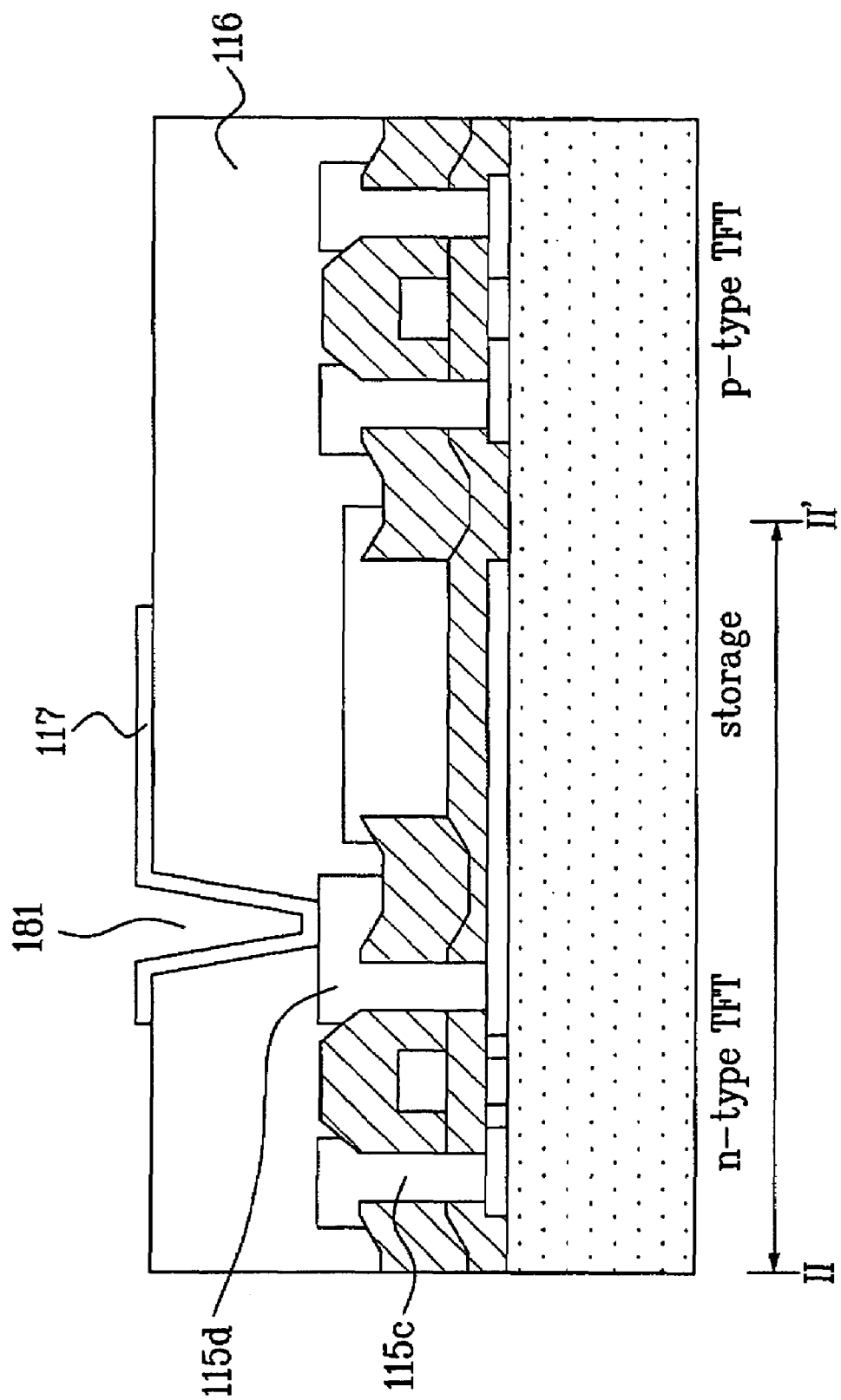
FIG. 4J is a tenth cross-sectional view of the partially fabricated TFT array of FIG. 3.

The low-resistance metal layer in FIG. 4J may be patterned through photolithography using a fifth mask to form the first and second source/drain electrodes 115c, 115d, 125c and 125d that are connected to the first and second source/drain regions 115a, 115b, 125a and 125b, and the storage electrode 119 formed in the storage open region. By this process, the n-type TFT including the first gate electrode 112, the first source/drain electrodes 115c and 115d, and the first channel layer 114 is formed in the pixel region or the driving circuit region. The p-type TFT including the second gate electrode 122, the second source/drain electrodes 125c and 125d and the second channel layer 124 is formed in the driving circuit region. These structures create a TFT array such as a CMOS-TFT that includes an n-type TFT and the p-type TFT.

At this stage, the first and second source electrodes 115c and 125c shown in FIG. 4I extend in opposite directions from the data line 115 shown in FIG. 3, and the first and second drain electrodes 115d and 125d are formed at a predetermined interval from the first and second source electrodes 115c and 125c. The storage electrode 119 shown in FIG. 4H is positioned across from or opposite to the second semiconductor layer 154b, and the gate insulating layer 113 is interposed there-between to form the storage capacitor. In this embodiment, the storage electrode 119 is a unitary part of the storage line 119a of FIG. 3 in parallel with the data line 115. The storage electrode 119 receives voltage from the outside of the active region.

As shown in FIG. 4I, an inorganic insulating material such as silicon nitride or silicon oxide may be deposited on the entire surface of the insulating substrate 111 including the first and second source/drain electrodes 115c, 115d, 125c and 125d. Alternatively, an organic insulating material such as BCB (Benzocyclobutene) or acrylic material may be deposited on the entire surface of the insulating substrate, thereby forming the passivation layer 116. The passivation layer 116 may be patterned to expose the first drain electrode 115d through photolithography using a sixth mask to form a second contact hole 181.

Referring to FIG. 4J, ITO (indium-tin-oxide) or IZO (indium-zinc-oxide) may be deposited in contact with the first drain electrode 115d through the second contact hole 181. A pixel electrode 117 may then be formed in the pixel region through photolithography using a seventh mask. In some embodiments accordingly, the above-described TFT array substrate may requires only seven masking acts, to create an n-type and p-type TFTs substrate array.

The inventions encompass many alternatives. For instance, an opposing substrate having a color filter layer and a common electrode may be formed across from or directly opposite to the TFT substrate array. In this embodiment, the array substrate and the color filter substrate are coupled to each other with a liquid crystal injected between the two substrates. Once the liquid crystal is injected between the substrates, a liquid crystal inlet is sealed to form an LCD device. The term couple or coupled, in all uses, herein, is intended to encompass both direct and indirect coupling. Thus, an array substrate and a color filter are said to be coupled together when they are in direct contact, as well as when the array substrate couples an intermediate part which couples the color filter directly or via one or more additional parts.

As described the fabricating method minimizes the acts needed to pattern TFT arrays on substrates. In an embodiment that follows a gate etch back process an n-type doping layer and the storage doping layer are formed at the same time decreasing the number of masks needed to fabricate the TFT array. Also, a diffraction exposure process that allows openings in the insulating interlayer of the storage region while exposing the source/drain regions of the n-type TFT and the p-type TFT, also decreases the number of masks needed to fabricate the TFT array. When both processes are used together, the number of masks needed to fabricate a TFT decreases by two. The above described system and method may be used to fabricate many TFT arrays including CMOS-TFT array substrates, which decreases the fabrication cost and time, and improves efficiency and production.

While various embodiments of the invention have been described above, it will be apparent to those of ordinary skill in the art that many more embodiments and implementations are possible and within the scope of the invention. Accordingly, the invention is not to be restricted except in light of the claims and their equivalents.

What is claimed is:

1. A method of making a CMOS-TFT array substrate comprising:
    providing a first semiconductor layer having first source/drain regions, a second semiconductor layer having a storage layer, and a third semiconductor layer having second source/drain regions between a substrate and a gate insulating layer;
    providing an insulating interlayer across an upper surface that extends across a length of the substrate such that the insulating interlayer covers the first source/drain regions and the second source/drain regions;
    doping the storage layer through the gate insulating layer while doping the first source/drain regions through the gate insulating layer; and
    providing a storage electrode on the insulating interlayer overlapping the doped storage layer to form a storage capacitor.

2. The method of claim 1 where the act of doping further comprises doping the second source/drain regions while doping the first/source drain regions.

3. The method of claim 2 further comprising the act of re-doping the second source/drain regions after doping the second source/drain regions.

4. The method of claim 3 where the act of re-doping comprises doping the second source/drain regions such that the second source/drain regions that have been re-doped are of opposite type than the doped first source/drain regions.

5. The method of claim 3 further comprising the act of opening selective parts of the insulating interlayer and gate layer simultaneously to expose portions of the first source/drain regions, the second source/drain regions, and a storage region.

6. The method of claim 5 where the act of opening selective parts of the insulating layer and gate layer comprises exposing a plurality of source/drain regions and an insulating interlayer surface through separate openings.

7. The method of claim 3 where the second source/drain regions are re-doped through the gate insulating layer.

8. The method of claim 1 where the entire storage layer is doped while doping the first source/drain regions.

9. The method of claim 1 where the act of doping comprises exposing the first source/drain regions to an n-type dopant.

10. The method of claim 1 further comprising the act of removing the insulating interlayer contacting the gate insulating layer above the doped storage layer before providing the storage electrode.

11. The method of claim 10 where the insulating interlayer contacts the gate insulating layer in regions other than between the storage electrode and the doped storage layer before the storage electrode is provided.

12. The method of claim 1 further comprising:
providing a first gate electrode on the gate insulating layer above the first semiconductor;
providing photoresist on the first gate electrode before doping the storage layer and the first source/drain regions;
ashing the photoresist after doping the storage layer and the first source/drain regions to thin the photoresist on the first gate electrode;
etching sidewalls of the first gate electrode; and
doping portions of the first semiconductor layer through the gate insulating layer exposed by the etched sidewalls to form LDD regions.

13. The method of claim 1 where the storage electrode extends from a storage line in parallel with a data line, and the storage layer and storage electrode are substantially _-shaped.

14. A method of fabricating a CMOS-TFT array substrate comprising:
forming a first semiconductor layer, a second semiconductor layer, and a third semiconductor layer on a substrate;
forming a gate insulating layer across an entire length of the substrate;
forming a first gate electrode and a second gate electrode on the gate insulating layer above the first semiconductor and the third semiconductor layers, respectively;
forming an n-type layer in the first semiconductor layer through the gate insulating layer while forming an n-type layer in a storage layer of the second semiconductor layer through the gate insulating layer;
forming a p-type layer in the third semiconductor layer through the gate insulating layer;
forming an insulating interlayer across an upper surface that extends across a length of the substrate including the first and second gate electrodes;
exposing portions of the n-type layer and the p-type layer while removing the insulating interlayer above the second semiconductor layer through a diffraction exposure;
forming source/drain electrodes coupled to the n-type layer and the p-type layer simultaneously with a storage electrode; and
forming a pixel electrode that couples the source/drain electrodes.

15. The method of claim 14, further comprising:
etching sidewalls of the first and second gate electrodes; and
forming a LDD doping layer having an n-type impurity by using the gate electrodes as a mask, after forming the n-type layer and a storage doping layer.

16. The method of claim 15, where the act of etching the sidewalls comprises an etch back process.

17. The method of claim 14 where the act of exposing exposes the n-type layer and the p-type layer through a half-tone mask or a slit mask.

18. The method of claim 14, where the electron rich layer is formed in the first semiconductor layer adjacent to a plurality of sides of the first gate electrode.

19. The method of claim 14 where the n-type layer and a storage doping layer are formed by n-type ions using the first and second gate electrodes as masks.

20. The method of claim 14 where the p-type layer is formed in the third semiconductor layer adjacent to a plurality of sides of the second gate electrode.

21. The method of claim 14 where the p-type layer is formed by p-type impurity ions while using the second gate electrode as a mask.

22. The method of claim 21 where the act of forming a p-type layer comprises implanting p-type ions within the third semiconductor layer after implanting n-type ions in the third semiconductor layer.

23. The method of claim 14, where the act of forming the storage layer comprises sweeping doping ions across an entire upper surface of the second semiconductor layer.

24. The method of claim 14 where the storage layer and the storage electrode form a storage capacitor.

25. The method of claim 24 further comprising forming a gate insulating layer between the storage layer and the storage electrode.

26. The method of claim 14 further comprising forming a buffer layer on the substrate.

27. The method of claim 14 further comprising forming a gate insulating layer between the firstly semiconductor layer and the first gate electrode and between the third semiconductor layers and the second gate electrode.

28. The method of claim 14 further comprising forming a passivation layer between the source/drain electrodes and the pixel electrode.

29. The method of claim 14 where the first and second gate electrodes are formed of a metal or polysilicon.

30. The method of claim 14 where the insulating interlayer in regions other than above the second semiconductor layer removed through the diffraction exposure contacts the gate insulating layer.

31. The method of claim 14 where the storage electrode extends from a storage line in parallel with a data line, and the second semiconductor layer and storage electrode are substantially _-shaped.

* * * * *